United States Patent [19]

Walker

[11] 4,322,785
[45] Mar. 30, 1982

[54] TRANSISTOR SWITCHING CIRCUIT

[75] Inventor: John D. Walker, Coventry, England

[73] Assignee: The General Electric Company Limited, London, England

[21] Appl. No.: 148,813

[22] Filed: May 12, 1980

[30] Foreign Application Priority Data

May 18, 1979 [GB] United Kingdom ............... 17317/79

[51] Int. Cl.³ .......................................... H02P 13/22
[52] U.S. Cl. ...................................... 363/21; 307/270; 307/300; 323/289
[58] Field of Search ................................. 363/19–26, 363/97, 134; 323/289; 307/270, 300

[56] References Cited

U.S. PATENT DOCUMENTS

| | | | |
|---|---|---|---|
| 3,836,836 | 9/1974 | Cowett | 363/22 |
| 3,958,168 | 5/1976 | Grundberg | 363/21 |
| 3,962,626 | 6/1976 | Cardwell | 363/134 |
| 3,999,086 | 12/1976 | Ekelund | 323/289 |
| 4,061,931 | 12/1977 | Boschert | 323/289 |
| 4,070,071 | 1/1978 | Harnden et al. | 363/134 |
| 4,074,146 | 2/1978 | Buonavita | 307/60 |

FOREIGN PATENT DOCUMENTS

| | | | |
|---|---|---|---|
| 1456338 | 11/1976 | United Kingdom. | |
| 570963 | 8/1977 | U.S.S.R. | 363/20 |
| 613464 | 6/1978 | U.S.S.R. | 363/21 |

OTHER PUBLICATIONS

IBM Technical Disclosure Bulletin, vol. 9, No. 7, Dec. 1966, pp. 932, 933.

*Primary Examiner*—William H. Beha, Jr.
*Attorney, Agent, or Firm*—Kirschstein, Kirschstein, Ottinger & Cobrin

[57] ABSTRACT

A driving circuit for a power transistor switch in which a feedback transformer between the collector path of the power transistor and that of the driver transistor is used to provide a current drive to the power transistor that is proportional to the load current, and in which a reverse current drive, also proportional to the load current is applied by way of a third winding on the transformer to the emitter-base circuit of the power transistor to decrease the switching-off time of that transistor.

6 Claims, 2 Drawing Figures

TRANSISTOR SWITCHING CIRCUIT

The present invention relates to transistor switching circuits.

In particular, but not exclusively, the invention relates to transistor switching circuits for use in D.C. to D.C. convertors.

In transistor switching circuits in which an output transistor is driven into saturation in order to ensure a low forward voltage drop across its output, the amount of charge stored in the base region of the output transistor during saturation can appreciably delay the switching-off of current in the output path unless steps are taken deliberately to remove this charge.

According to one aspect of the present invention in a transistor switching circuit in which first and second windings of a transformer are arranged to provide positive feedback from an output path of a transistor to an input path thereof, there are provided a third winding on said transformer and means responsive to the cessation of current flow in one of said first and second windings to provide a reverse bias current for said transistor from said third winding.

Preferably said positive feedback is applied to the input path of said transistor by way of a further transistor. The means responsive to cessation of current flow in one of said first and second windings may include a zener diode connected in series with said third winding.

According to another aspect of the present invention a transistor switching circuit comprises a first transistor, a transformer having a first winding connected in an output path of said first transistor, a second winding connected in the collector-emitter circuit of a driver transistor in such a sense as to provide positive feedback between said output path and an input circuit to said first transistor when said driver transistor is conducting, and voltage-breakdown means connected in series with a third winding of said transformer in said input circuit to said first transistor to provide a reverse-bias current for said first transistor when said driver transistor ceases to conduct.

A D.C. to D.C. convertor may comprise two of said transistor switching circuits energised from a common D.C. source and operating alternately to supply current pulses to a common load. The current pulses may be width-modulated in such a way as to control the voltage applied to the load.

A D.C. to D.C. convertor incorporating two transistor switching circuits each in accordance with the present invention will now be described by way of example with reference to the accompanying drawings, of which:

Figure 1:
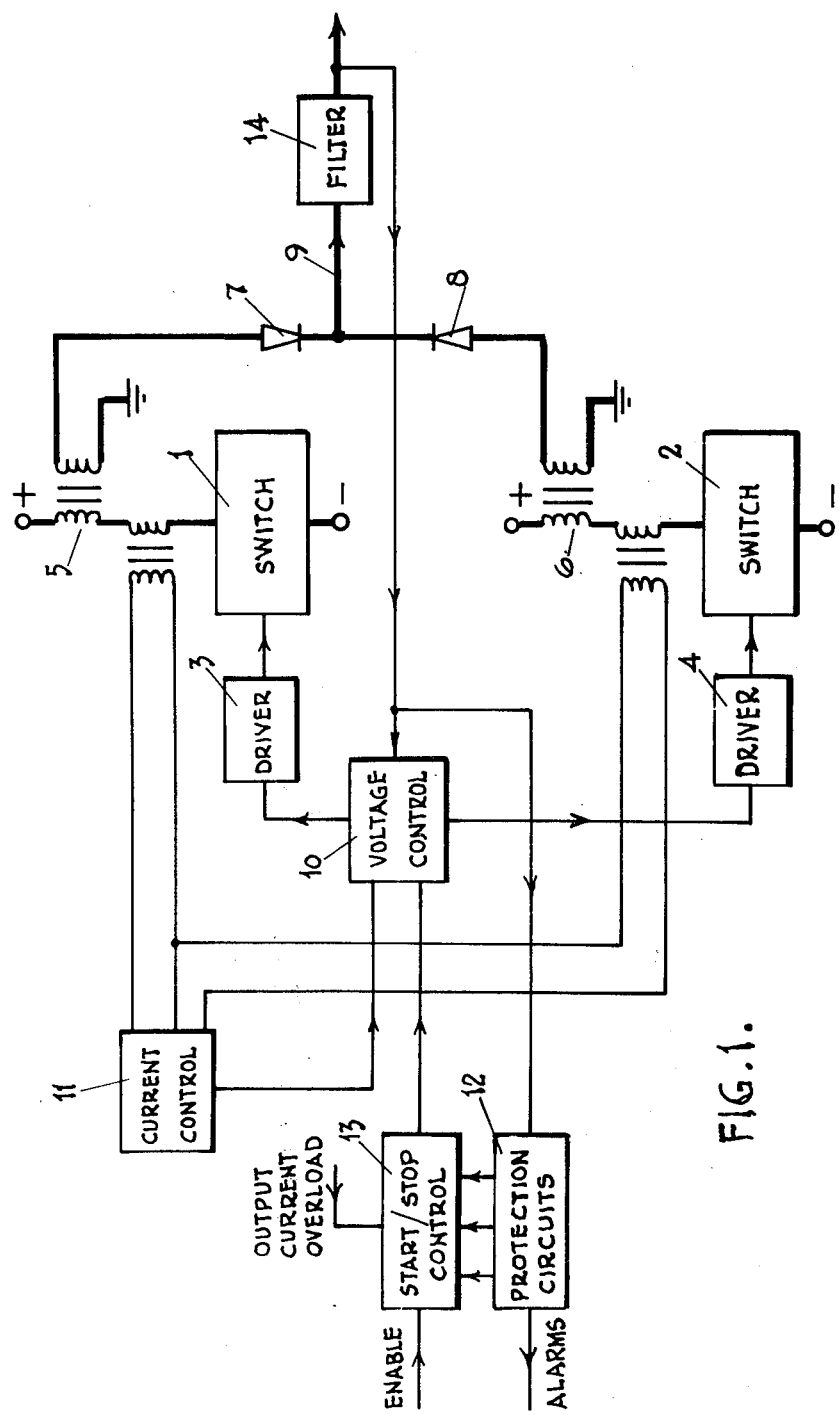
FIG. 1 shows the convertor schematically.

Referring first to FIG. 1 the D.C. to D.C. convertor comprises two transistor switching circuits 1 and 2 operating under the control of respective driver circuits 3 and 4 to supply current pulses from a common D.C. source (not shown) to respective output transformers 5 and 6. The respective secondary windings of these transformers are connected by way of respective rectifiers 7 and 8 to a common output path 9, which in turn may be connected to a load (not shown) by way of a filter circuit 14.

The driver circuits 3 and 4 each receive a train of substantially constant amplitude rectangular pulses from a voltage control circuit 10, the pulses in the two trains being interlaced, and these pulses being width modulated in dependence upon the voltage at the output of the filter 14 such that in operation this voltage is maintained substantially constant.

A current control circuit 11, responsive to the output currents of the two switches 1 and 2, provides an input to the voltage control circuit 10 such as effectively to prevent these currents from exceeding predetermined values. Similarly, protection circuits 12 may be arranged to disable the convertor, by way of control circuit 13, in the event of the output voltage moving outside predetermined limits, while a relay (not shown) in the output current path 9 may be arranged to disable the convertor if the current in that path exceeds a predetermined value.

Figure 2:
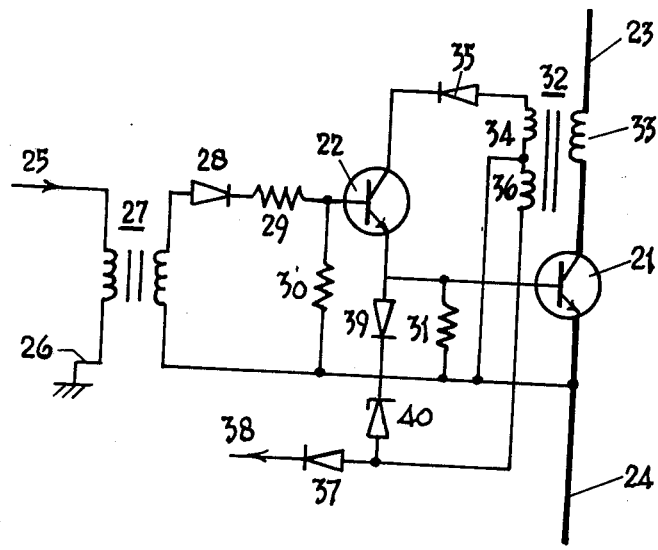
FIG. 2 shows one of the transistor switching circuits of the convertor diagrammatically.

Referring now to FIG. 2, each of the transistor switching circuits comprises an n-p-n power transistor 21 to switch current in an output path 23, 24 in dependence upon an input signal applied between a pair of inputs 25 and 26. The input pulse signal is applied by way of a transformer 27, a semiconductor diode 28 and a resistor 29 between the base electrode of the transistor 22 and the path 24. The base electrode of the transistor 22 is connected to the path 24 by way of a resistor 30, while the emitter electrode is connected to the path 24 by way of a resistor 31 and directly to the base electrode of the transistor 21.

A feedback transformer 32 has its primary winding 33 connected in the output path 23, 24 and a secondary winding 34 connected by way of a semiconductor diode 35 between the path 24 and the collector electrode of the transistor 22. Another secondary winding 36 of the transformer 32 is connected by way of a semiconductor diode 37 between the path 24 and a positive supply line 38. The emitter electrode of the transistor 22 is connected to the junction between the winding 36 and the diode 37 by way of a semiconductor diode 39 and a semiconductor breakdown diode or zener diode 40.

In operation the variable width input pulse signal applied between the inputs 25 and 26 will forward bias the diode 28 and the base-emitter diodes of the transistor 22 and the transistor 21, allowing current to flow through the collector-emitter path of the transistor 21 and the path 23, 24. The consequent current flow through the primary winding 33 of the transformer 32 induces a current in the secondary winding 34 in such a sense that the diode 35 is forward biased, and induced current then flows through the collector-emitter path of the transistor 22 to augment the forward bias current flowing into the base electrode of the transistor 21. The turns ratio of the windings 33 and 34 may be arranged substantially to equal the current gain of the transistor 21 so as to provide an appropriate base drive current for the transistor 21, which completes switching-on and saturates.

During the switching-one period the winding 36 applies a reverse voltage across the zener diode 40, but while the transistor 22 is conducting this voltage is insufficient to cause the diode 40 to break down. When the positive drive current through the diode 28 and the resistor 29 ceases the transistor 22 will cease to conduct, but the transistor 21 will continue to conduct current due to the saturation charge storage in its base region. When the transistor 22 ceases to conduct the current flow in the transformer winding 34 is cut off, and the voltages induced in that winding and the winding 36 rise until the zener diode 40 breaks down. Current then flows by way of the diode 39 in such a direction as to remove the stored charge from the base region of the transistor 21. When the stored charge has been removed the transistor 21 turns off and the current flow in the winding 33 of the transformer 32 ceases. Any remaining energy in the transformer 32 will then be dissipated by current flow to the positive supply rail 38 by way of the diode 37, or through a suitable zener diode (not shown) to the path 24 by way of the diode 37. The turns ratio of the windings 34 and 36 may be chosen to give a desired ratio between turn-on and turn-off current.

I claim:

1. A transistor switching circuit comprising a first transistor, a transformer having a first winding connected in an output path of said first transistor, a second winding connected in the collector-emitter circuit of a driver transistor in such a sense as to provide positive feedback between said output path and an input circuit to said first transistor when said driver transistor is conducting, and voltage-breakdown means connected in series with a third winding of said transformer in said input circuit to said first transistor to provide a reverse-bias current for said first transistor when said driver transistor ceases to conduct.

2. A D.C. to D.C. convertor comprising two transistor switching circuits each in accordance with claim 1, said circuits being energised from a common D.C. source and operating alternately to supply current pulses to a common load.

3. A D.C. to D.C. convertor in accordance with claim 2 wherein the current pulses are width modulated in such a way as to control the voltage applied to the load.

4. A transistor switching circuit in accordance with claim 1 wherein the voltage-breakdown means is a zener diode.

5. A transistor switching circuit in accordance with claim 1 wherein there are provided means to remove stored energy from said transformer when said first transistor ceases to conduct.

6. A transistor switching circuit in accordance with claim 5 wherein said means to remove stored energy comprises a diode connected between said third winding and a current supply path of said switching circuit.

* * * * *